(12) United States Patent
Wu et al.

(10) Patent No.: US 9,927,029 B2
(45) Date of Patent: Mar. 27, 2018

(54) MULTILAYER MULTI-ELEMENT COMPOSITE HARD PVD COATING ON THE SURFACE OF A PISTON RING, A PISTON RING AND A PREPARATION PROCESS

(71) Applicant: ASIMCO Shuanghuan Piston Ring (Yizheng) Co., Ltd., Yizheng Jiangsu (CN)

(72) Inventors: Yingxue Wu, Yizheng Jiangsu (CN); Qianxi Liu, Yizheng Jiangsu (CN); Bo Zhang, Yizheng Jiangsu (CN)

(73) Assignee: ASIMCO Shuanghuan Piston Ring (Yizheng) Co., Ltd. (CN)

( * ) Notice: Subject to any disclaimer, the term of this patent is extended or adjusted under 35 U.S.C. 154(b) by 76 days.

(21) Appl. No.: 14/478,497

(22) Filed: Sep. 5, 2014

(65) Prior Publication Data

US 2015/0211635 A1    Jul. 30, 2015

(30) Foreign Application Priority Data

Jan. 29, 2014   (CN) .......................... 2014 1 0043806

(51) Int. Cl.
*F16J 9/26*     (2006.01)
*C23C 14/00*    (2006.01)
(Continued)

(52) U.S. Cl.
CPC .............. *F16J 9/26* (2013.01); *C23C 14/0021* (2013.01); *C23C 14/022* (2013.01);
(Continued)

(58) Field of Classification Search
CPC ...... F16J 9/26; C23C 14/0641; C23C 28/347; C23C 14/024; C23C 14/027; C23C 28/044; C23C 28/048; C23C 16/029
See application file for complete search history.

(56) References Cited

U.S. PATENT DOCUMENTS

| 7,348,074 B2* | 3/2008 | Derflinger ........... C23C 14/0641 |
| | | 428/216 |
| 7,879,443 B2* | 2/2011 | Endrino .................. C23C 30/00 |
| | | 428/336 |

(Continued)

FOREIGN PATENT DOCUMENTS

| DE | 102008017583 | 10/2009 |
| DE | 102012207814 | 11/2013 |

OTHER PUBLICATIONS

Beliardough et al., "Tribological performance of Cr/CrN and Cr/CrN/CrAlN multilayer coatings deposited by r.f. magnetron sputtering", 40th Leeds-Lyon Symposium on Tribology & Tribochemistry Forum 2013, Sep. 4-6, 2013, Lyon, France. Available http://tribo-lyon2013.sciencesconf.org/17789/document.*

(Continued)

*Primary Examiner* — Nicholas L Foster
(74) *Attorney, Agent, or Firm* — Barnes & Thornburg LLP; Jeffrey R. Stone

(57) ABSTRACT

The invention relates to a multilayer multi-element composite hard PVD coating with low friction coefficient on the surface of a piston ring, a piston ring and a preparation process. The present invention employs vacuum multi-arc ion plating vapor deposition process, which uses multiple multi-arc ion sources, in the combination of equipping with different single metal target material and multi-element target material to deposit multilayer multi-element composite hard PVD coating with low friction coefficient on the surface of a steel or cast iron piston ring. The coating consists of five layers with the total thickness of up to 60 μm. The coating has high adhesion with the surface of piston ring, high hardness, low friction coefficient and good abrasion resistance. By controlling the adding amount of additive elements Al, Mo, W, B, Si and Ti, the friction coefficient (Continued)

of the coating can be further reduced 5 to 20% compared with that of a single TiN or CrN deposited layer.

15 Claims, 3 Drawing Sheets

(51) Int. Cl.
*C23C 14/02* (2006.01)
*C23C 14/06* (2006.01)
*C23C 28/00* (2006.01)
*C23C 14/32* (2006.01)

(52) U.S. Cl.
CPC .......... *C23C 14/025* (2013.01); *C23C 14/027* (2013.01); *C23C 14/028* (2013.01); *C23C 14/0641* (2013.01); *C23C 14/325* (2013.01); *C23C 28/322* (2013.01); *C23C 28/347* (2013.01); *C23C 28/36* (2013.01)

(56) References Cited

U.S. PATENT DOCUMENTS

| | | | | |
|---|---|---|---|---|
| 2005/0263261 | A1* | 12/2005 | Moore | B22C 3/00 164/312 |
| 2008/0095939 | A1* | 4/2008 | Fischer | C23C 14/0641 427/255.394 |
| 2009/0075114 | A1* | 3/2009 | Hovsepian | C23C 14/022 428/650 |
| 2009/0241632 | A1* | 10/2009 | Young | B21D 37/20 72/470 |
| 2010/0044968 | A1* | 2/2010 | Fischer | C23C 14/0641 277/443 |
| 2010/0129644 | A1* | 5/2010 | Endrino | C23C 30/00 428/336 |
| 2010/0171272 | A1* | 7/2010 | Hoppe | C23C 14/0036 277/444 |
| 2013/0214493 | A1* | 8/2013 | Cha | C23C 14/0057 277/442 |
| 2013/0303414 | A1* | 11/2013 | Ramm | C23C 14/0084 508/108 |
| 2013/0334773 | A1* | 12/2013 | Lu | F16J 9/062 277/442 |
| 2014/0037943 | A1* | 2/2014 | Cao | C23C 14/0057 428/336 |
| 2014/0144200 | A1* | 5/2014 | Muller | B21D 22/022 72/364 |
| 2014/0287214 | A1* | 9/2014 | Cha | C23C 14/0676 428/217 |

OTHER PUBLICATIONS

"Gradient Coating", PLATIT®, https://web.archive.org/web/20130125073713/http://platit.com/gradient-coating, retreived Jan. 2013.*
Cao et al., "Syntheses of nano-multilayered TiN/TiSiN and CrN/CrSiN hard coatings", J. Coat. Technol. Res., 8 (2) 283-288, 2011 ( Year: 2011).*
China Surface Engineering, "Microstructure and Oxidation Resistance of CrAlN Composite Coatings on Piston Rings", vol. 23, No. 6, Dec. 2010.
EPO Extended Search Report, dated Jul. 16, 2015.

* cited by examiner

MULTILAYER MULTI-ELEMENT COMPOSITE HARD PVD COATING ON THE SURFACE OF A PISTON RING, A PISTON RING AND A PREPARATION PROCESS

TECHNICAL FIELD

The present invention relates to the technical field of piston ring surface treatment, in particular to a multilayer multi-element composite hard PVD coating on the surface of a piston ring, piston ring and preparation process.

BACKGROUND ART

Piston rings is one of the key components of the internal combustion engine, thus its wear and tear is a very significant for the overall fuel consumption of the engine. At present, vehicle engines (particularly diesel engines) is developing in the direction of high mechanical loads, high output power (high heat load), low fuel consumption and low exhaust emissions. Therefore the piston ring become thinner in thickness and lighter in weight, which requires high strength (thermal fatigue strength), abrasion resistance, pull-cylinder performance for the piston ring, as well as the sliding characteristics of no much wear of the cylinder sleeve. Advanced surface treatment technology has been vigorously promoted the popularized in the field of the piston rings. In recent years, the steel piston rings previously often used in gasoline are gradually introduced to the field of diesel engines and the steel ring began to be used in some diesel engines. At present, more advanced nitriding, spraying molybdenum and PVD technologies have been widely adopted for the steel ring.

During the engine running, the piston ring of the engine is subjected to not only the impact of thermal fatigue and thermal stress, but also the impact of wear and adhesion arising from the most of the side pressure produced by the pressure action of the gas eruption during combustion. Surface treatment of steel ring has become an indispensable process technology. The common method is ion nitriding treatment for the steel ring to form a wearable nitride layer. Due to the significant improvement of the hardness of the edge area and the attendant special nitrogen precipitates, the wear and tear of cylinder sleeve of the piston ring is greatly reduced and good coordination of the side of piston ring and the side of the ring groove is improved. However, the wearability and relatively low thermal load capacity of the nitriding steel ring are generally insufficient for the first piston ring used in the modern engine.

The most recent generation of piston ring coating is made by the physical vapor deposition method (PVD). Currently, the mainstream surface treatment method is depositing nitride (TiN, CrN, etc.) on the outer round working face of the piston ring. The performance characteristics of the formed coating is high hardness (between 1000 and 2000 HV) and the crystal tissue of ceramic, thereby the coating exhibits low wear and tear rate and high chemical stability. But this coating process derived from the thin film make the application of PVD coating on the piston ring limited. It has been found that when the coating has a thickness of more than 50 μm, adhesion and cracking problems of the coating will occur due to the extremely high inner stress of the coating.

To improve the efficiency and lifetime of piston systems, abrasion-resistant coating with high hardness is gradually widely used. However, although hard coatings can significantly improve the wear life of the friction pair of cylinder sleeve and piston ring, it still does not affect the friction coefficient of their relative movement much. There are effective methods of amorphous carbon coating with the characteristics of both low friction and low wear and tear, such as DLC (diamond like carbon) or GLC (graphite-like carbon). This coating not only has high hardness (~20 GPa), but also has extremely low friction coefficient (<0.1) under oil environment especially the lean oil conditions, which makes it the most promising material of friction reduction and anti-wear of the engine system. However it cannot completely solve the problems of high temperature stability, coating brittleness and long-lasting abrasion resistance.

SUMMARY OF THE INVENTION

The object of the present invention is to reduce friction coefficient of the coating and improve the abrasion-resistant performance through addition of appropriate multi elements on the basis of the single abrasion-resistant coating with high hardness. Meanwhile, multi-layer coating structure is utilized to reduce coating stress, improve coating adhesion and increase the deposition thickness of the coating.

The present invention employs a vacuum multi-arc ion deposited vapor deposition process, which uses a number of multi-arc ion sources, in the combination of equipping with different single metal target material and multi-element target material, to deposit a multilayer multi-element composite hard PVD coating with low friction coefficient on the surface of a steel or cast iron piston ring (with or without a nitride layer).

To achieve this object, the present invention employs the following technical solutions:

The first aspect of the present invention is to provide a multilayer multi-element composite hard PVD coating, wherein the coating consists of, from the bottom to the top, a single metal adhesion underlayer, a single nitride ramping layer, a single nitride deposited layer, a multi-element nitride ramping layer and a multi-element nitride deposited layer.

The single metal of the present invention is Cr. The single nitride deposited layer is of CrN. The multi-element nitride deposited layer is of Cr(Me)N, wherein Me is one selected from the group elements consisting of Al, Mo, W, B, Si and Ti, and combination thereof. Wherein, the typical but non-limiting examples of Me include: the combination of Al, Mo, W, B, Si, Mo, and B, the combination of W and B, the combination of Mo and Si, the combination of Mo, W and Si, the combination of W, Mo and B, etc. All of them can be used to carry out the present invention.

Lubricating elements including Al, Mo, W, Si, B, Ti etc can be added into the coating alone or in combination to form the outermost hard deposited layer of Cr(Me)N, thereby maintaining or enhancing the overall hardness of the coating to 1600-2600 HV, and reducing its friction coefficient from 0.6-0.7 to 0.3-0.6.

The single metal underlayer has a thickness of 1-4 μm, such as 1.01-3.9 μm, 1.2-3.56 μm, 1.43-3.3 μm, 2.7-3.14 μm, 2.95-3.1 μm, 3.04 μm, etc.

The single nitride ramping layer has a thickness of 1-6 μm, such as 1.01-5.9 μm, 1.2-4.56 μm, 2.43-3.3 μm, 2.7-3.14 μm, 2.95-3.1 μm, 3.04 μm, etc.

The single nitride deposited layer has a thickness of 5-20 μm, such as 5.02-19.6 μm, 10-18 μm, 14.5-16 μm, 15.3 μm etc.

The multi-element nitride ramping layer has a thickness of 2-10 μm, such as 2.02-9.96 μm, 3.4-9.6 μm, 5.86-9.2 μm, 6.3-8.6 μm, 7-8.2 μm, 7.5 μm, etc.

The multi-element nitride deposited layer has a thickness of 5-20 μm, such as 5.02-19.6 μm, 10-18 μm, 14.5-16 μm, 15.3 μm, etc.

The coating has a total thickness of 14-60 μm, such as 14.01-59.8 μm, 15-56 μm, 16.7-54.2 μm, 18-51 μm, 20.3-47 μm, 26-43 μm, 29.7-40 μm, 32-37.5 μm, 34 μm, etc.

The second aspect of present invention is to provide a piston ring with the multi-layer multi-element composite hard PVD coating, wherein the piston ring is subjected to nitriding treatment or not. Optionally, there is a nitride layer between the surface of the piston ring and the coating. The nitride layer can be generated by ion nitriding treatment or gas nitriding treatment.

The third aspect of the present invention is to provide a preparation process of the multi-layer multi-element composite hard PVD coating on the surface of the piston ring. This process can be used for preparation of the multi-layer multi-element composite hard PVD coating on the surface of piston ring described above.

The process is conducted in a PVD vacuum deposited device and comprises the following steps:
(1) subjecting the surface of a piston ring to plasma cleaning or other cleaning treatments;
(2) igniting a single metal target material cathodes to generate cold field induced arc discharge and depositing a single metal adhesion underlayer on the surface of the piston ring;
(3) gradually introducing nitrogen gas; depositing a single nitride ramping layer with increasing nitrogen content on the single metal underlayer; and subsequently depositing a single nitride deposited layer;
(4) igniting a multi-element target material cathodes, gradually increasing its cathode current, and depositing a multi-element nitride ramping layer with increasing metal content on the single nitride deposited layer; finally depositing the multi-element nitride deposited layer with a constant amount of different elements.

In the step (2), the vacuum degree in the vacuum chamber is controlled within 1.02-1.38 Pa, and bias voltage of the piston ring is adjusted to between −17 and −23V. The vacuum degree can be selected as 1.03-1.37 Pa, 1.06-1.33 Pa, 1.1-1.3 Pa, 1.15-1.22 Pa, 1.18 Pa, etc. The bias voltage can be selected as −17.01-22.9V, −19-21V, −20.4V etc.

After the nitrogen gas is purged in the step (3), the bias voltage of the piston ring is adjusted to between −30 and −40V, for example, v −30.01 and −39.8V, between −33 and −37.5V, between −34.2 and −36V, −35.2V, etc. Preferably, the single nitride ramping layer is deposited till the single nitride deposited layer is deposited after the vacuum degree is kept at 4-6 Pa. The vacuum degree can be selected as 4.02-5.96 Pa, 4.3-5.7 Pa, 4.39-5.2 Pa, 4.7-5 Pa, 4.85 Pa etc.

When the cathode current is increased to 60-80 A in the step (4), the cathode current is maintained and the multi-element nitride deposited layer is deposited. The cathode current can be selected as 60.02-79 A, 64-73.4 A, 67.6-70 A, 69 A, etc.

The process is ended after 5-20 h deposition. The deposition time can be selected as 5.02-19.8 h, 5.5-17 h, 8-14.3 h, 10.3-13 h, 11.2 h etc. The thickness of each layer is controlled by the deposition time with the maximum thickness of up to 60 μm.

After the piston ring is cooled to below 50° C., the vacuum chamber is opened to remove the piston rings out of the system.

Optionally, before the step (1), nitriding treatment and the subsequent surface grinding treatment are conducted; or surface grinding treatment is conducted without nitriding treatment, in order to remove the non porous microstructure to ensure the adhesion of the coating.

In particular, after optimization, a preparation process of multilayer multi-element composite hard PVD coating on the surface of a piston ring comprises the following steps:
(1) subjecting the surface of a piston ring to plasma cleaning or other cleaning treatments;
(2) controlling the vacuum degree in the vacuum chamber within 1.02-1.38 Pa; adjusting the bias voltage to between −17 and −23V; igniting the single metal target material cathodes to generate cold field induced arc discharge and depositing the single metal underlayer on the surface of the piston ring;
(3) gradually introducing nitrogen gas; adjusting the bias voltage of the piston ring to between −30 and −40V; depositing the single nitride ramping layer with increasing nitrogen content on the single metal underlayer till depositing the single nitride deposited layer after the vacuum degree is kept within 4-6 Pa;
(4) igniting the multi-element target material cathodes, gradually increasing its cathode current, and depositing the multi-element nitride ramping layer with increasing metal content on the single nitride deposited layer; when the cathode current is increased to 60-80 A, maintaining the cathode current; finally depositing the multi-element nitride deposited layer with a constant amount of different elements;
(5) ending the process after 5 to 20 h deposition; closing the gas supply system, the cathode system and bias voltage system etc.; after the piston rings being cooled to below 150° C., opening the piston vacuum chamber and removing the piston rings out of the system.

A combination of various single element target material target site and multi-element target material target site is employed to meet the requirement of preparing the hard PVD coating with low friction coefficient.

The single metal target material is Cr. The multi-element target material is selected from CrAl, CrMo, CrW, CrB, CrSi and CrTi based on the coatings The adding amount of Al, Mo, W, B, Si or Ti in the multi-element target material is 5-50% atm.

The number ratio of the cathode arc sources of the single metal target material to those of the multi-element target material is 2:3 or 3:2.

The purification treatment in the step (1) of the present invention may employ the common treatment method in the art. The typical but non-limiting example is:
after the piston ring to be plated is subjected to the degreasing, rinsing, dehydration, wind shear and drying treatments, the piston ring is mounted on the piston ring specific planetary rotating stand, to ensure the work face of the piston ring is the plated face. Vacuum is pumped and the heater in the vacuum chamber is started to heat the chamber to 400-450° C., the planetary rotating system is started at the same time to ensure the gas and vapor etc. remained on the surface of the piston ring to be timely discharged, till the vacuum degree is pumped to $5 \times 10^{-3}$ Pa. Argon is purged and a bias voltage of between −800 and −1000V is applied on the piston ring for ion etching on it, thereby a metal ion flow with high energy density will further sputter down the residual gas contaminants etc. on the surface of the piston ring, sufficiently purifying the plated face of the piston ring.

Compared with the prior art, the present invention has the following beneficial effects: the multilayer multi-element composite PVD coating of the present invention has good adhesion with the surface of the piston ring, high hardness and low coating stress. The coating thickness can be up to more than 60 μm without cracking. The overall hardness of the coating can reach 1600-2600 HV, while the friction coefficient is reduced to about 0.3 to 0.6. By Controlling the adding amount of the additive elements Al, Mo, W, B, Si and Ti, the friction coefficient of the coating can be further reduced 5 to 20% compared with the single TiN or CrN deposited layer.

The multilayer multi-element composite hard PVD coating can be applied not only on the surface of a steel or cast iron piston ring, but also on the surface of a steel or cast iron piston ring subjected to nitriding treatment.

Figure 1:
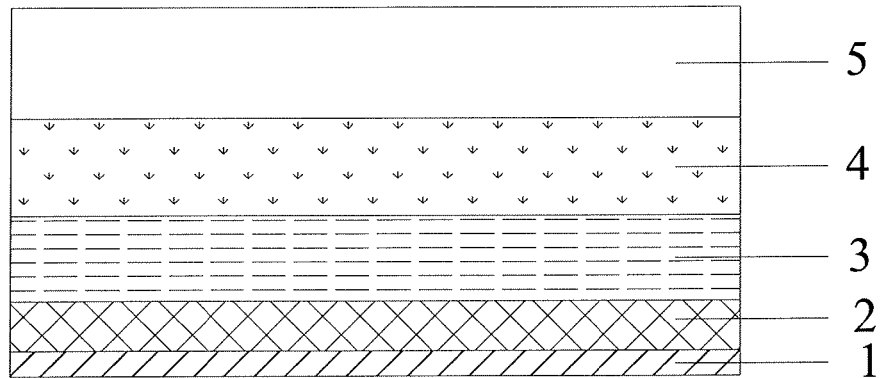
FIG. 1 shows the structure diagram of a multilayer multi-element composite hard PVD coating on the surface of a piston ring according to the present invention.

Wherein:
1—single metal underlayer; 2—single nitride ramping layer; 3—single nitride deposited layer; 4—multi-element nitride ramping layer; 5—multi-element nitride deposited layer; 6—cathode and multi-element alloy target material; 7—piston ring; 8—cathode and single element target material; 9—rotary clamp; 10—vacuum chamber.

Hereinafter, the present invention is further described in details. However, the following examples are merely simple examples of the present invention and do not represent or limit the scope claimed by the present invention. The protection scope of the invention prevails in the claims.

DETAILED DESCRIPTION

Hereinafter, the solutions of the present invention are further explained through the specific embodiments referring to the drawings. As used in the description and throughout the claims, the meaning of "a", "an", and "the" includes plural reference unless the context clearly dictates otherwise. Also, as used in the description and throughout the claims, the meaning of "in" includes "in" and "on" unless the context clearly dictates otherwise.

To better explain the invention and help the understanding of the solutions of the invention, typical but non-limiting examples are described as follows.

As shown in FIG. 1, a multi-layer multi-element composite hard PVD coating on the surface of a piston ring consists of, from the bottom to the top, a single metal adhesion underlayer 1, a single nitride ramping layer 2, a single nitride deposited layer 3, a multi-element nitride ramping layer 4 and a multi-element nitride deposited layer 5.

Figure 2:
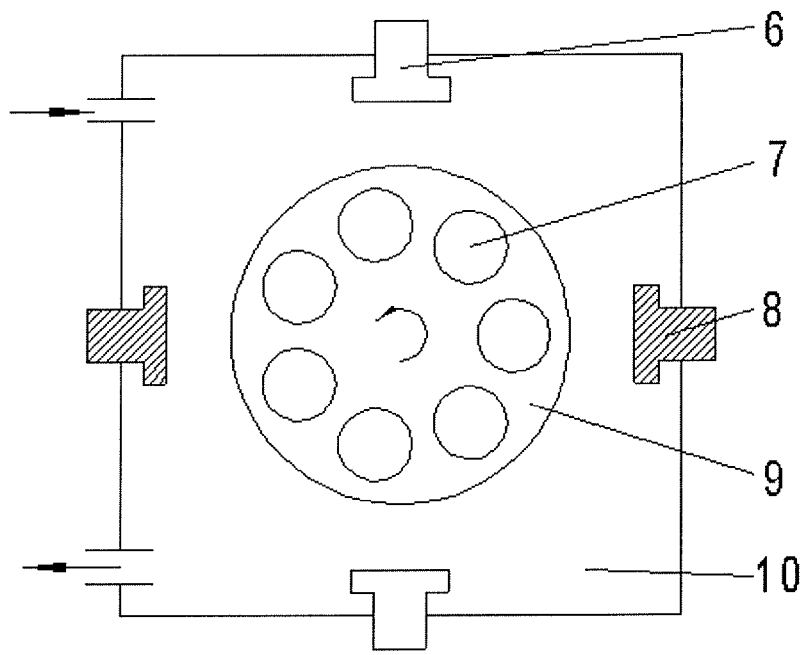
FIG. 2 shows a top view of the target site distribution of a multi-arc ion deposited layer device.
Figure 3:
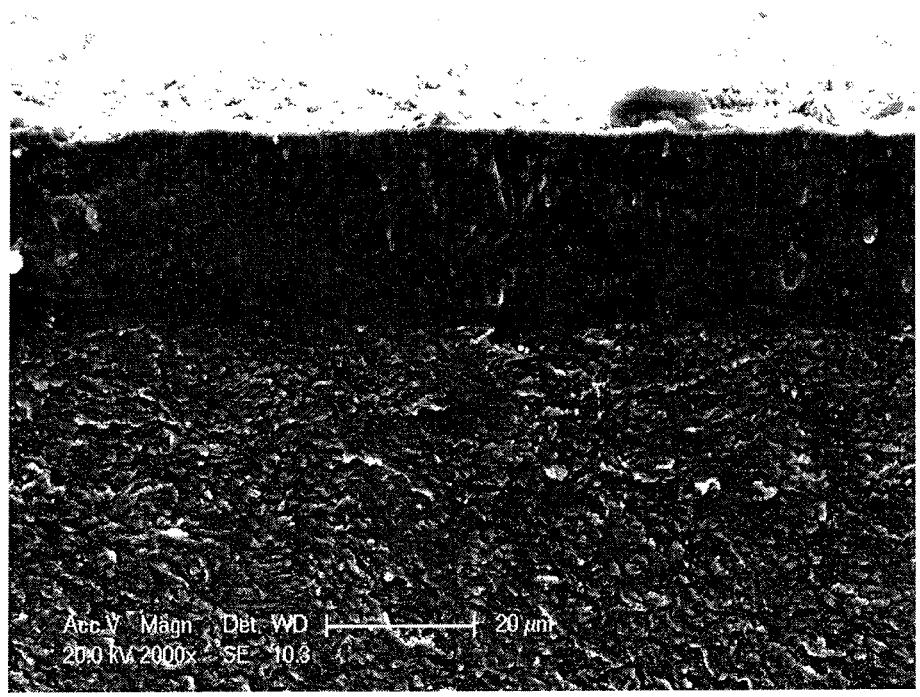
FIG. 3 shows the SEM morphology of a section of a CrMoN deposited layer.
Figure 4:
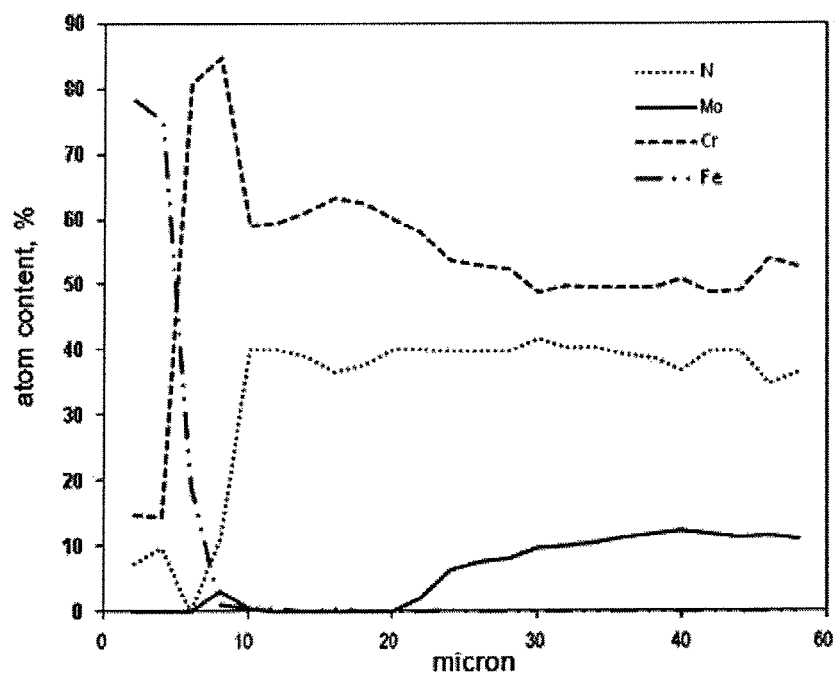
FIG. 4 is shows the line scanning result of each element (N, Mo, Cr or Fe) of a section of a CrMoN deposited layer.
Figure 5:
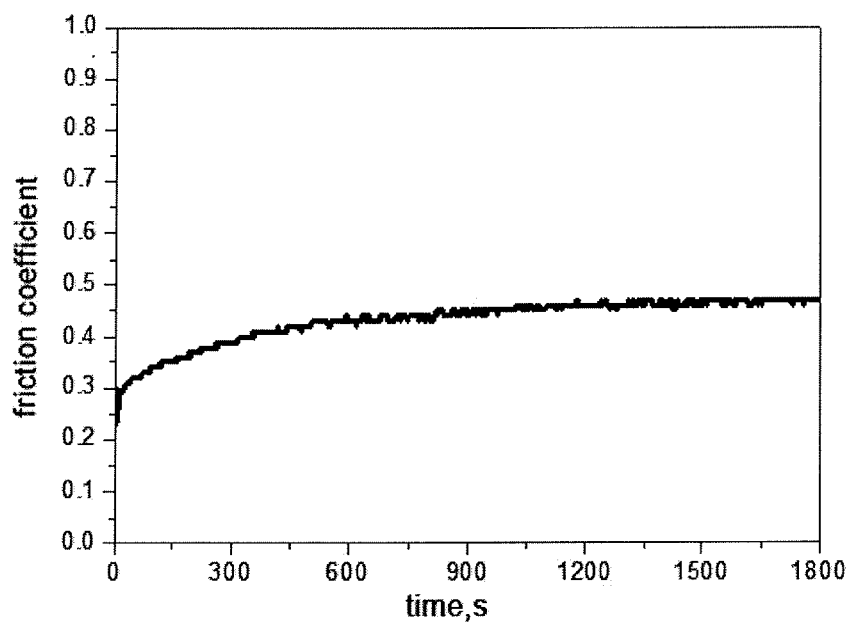
FIG. 5 shows the friction coefficient curve of a CrMoN deposited layer.

As shown in FIG. 2, on the chamber body of the production apparatus for the multilayer multi-element composite hard PVD coating is mounted single metal target material, Cr target material, and binary target material, CrMo target material. The multi-arc ion deposited apparatus comprises a vacuum chamber 10, a rotating clamp 9, a piston ring 7, cathode and multi-element alloy target material 6, cathode and single element target material 8.

Example 1

A multilayer multi-element composite hard PVD coating on the surface of a piston ring, consists of, from the bottom to the top, a Cr metal underlayer, a CrN ramping layer, a CrN deposited layer, a Cr(Mo)N ramping layer and a Cr(Mo)N deposited layer. The Cr metal underlayer has a thickness of 4 μm. The CrN ramping layer has a thickness of 6 μm. The CrN deposited layer has a thickness of 20 μm. The Cr (Mo) N ramping layer has a thickness of 10 μm. The Cr (Mo) N deposited layer has a thickness of 20 μm. The total thickness of the coating is 60 μm.

The present example provides a piston ring with the multilayer multi-element composite hard PVD coating, wherein the surface of the piston ring is not subjected to nitriding treatment.

The preparation process of the multilayer multi-element composite hard PVD coating on the surface of the piston ring is conducted in a PVD vacuum deposited apparatus, and comprises the following steps:

(1) subjecting the surface of a piston ring to plasma cleaning or other cleaning treatments; after the piston ring to be plated is subjected to the degreasing, rinsing, dehydration, wind shear and drying treatments, the piston ring is mounted on the piston ring specific planetary rotating stand, to ensure the work face of the piston ring is the plated face. Vacuum is pumped and the heater in the vacuum chamber is started to heat the chamber to 400-450° C., the planetary rotating system is started at the same time to ensure the gas and vapor etc. remained on the surface of the piston ring to be timely discharged, till the vacuum degree is pumped to $5\times10^{-3}$ Pa. Argon is purged and a bias voltage of −900V is applied on the piston ring for ion etching on it, thereby a metal ion flow with high energy density will further sputter down the residual gas contaminants etc. on the surface of the piston ring, sufficiently purifying the plated face of the piston ring;

(2) controlling the vacuum degree in the vacuum chamber at 1.2 Pa, adjusting the bias voltage of the piston ring to −20V, igniting Cr target material cathodes to generate cold field induced arc discharge and depositing a Cr metal underlayer on the surface of the piston ring;

(3) gradually introducing nitrogen gas, adjusting the bias voltage of the piston ring to −35V, depositing a CrN ramping layer with various nitrogen content on the Cr metal underlayer till depositing a uniform CrN deposited layer as the vacuum degree is maintained at 5 Pa;

(4) igniting CrMo target material cathodes, gradually increasing cathode current and depositing a Cr (Mo) N ramping layer with increasing metal content on the CrN deposited layer; when the cathode current is increased to 75 A, maintaining the cathode current and depositing a uniform Cr(Mo)N deposited layer;

(5) ending the process after 20 h deposition; turning off the gas supply system, cathode system, bias voltage system, etc.; after the piston ring is cooled to below 150° C., opening the vacuum chamber and removing the piston ring out of the system.

The adding amount of Mo element in the CrMo target material is 5% atm.

The number ratio of the cathode arc sources of the Cr metal target material to those of the CrMo target material is 2:3.

Example 2

A multilayer multi-element composite hard PVD coating on the surface of a piston ring, consists of, from the bottom to the top, a Cr metal underlayer, a CrN ramping layer, a CrN deposited layer, a Cr(Si)N ramping layer and a Cr(Si)N deposited layer. The Cr metal underlayer has a thickness of 1 μm. The CrN ramping layer has a thickness of 1 μm. The CrN deposited layer has a thickness of 5 μm. The Cr(Si)N ramping layer has a thickness of 2 μm. The Cr(Si)N deposited layer has a thickness of 5 μm. The total thickness of the coating is 14 μm.

The present example provides a piston ring with the multilayer multi-element composite hard PVD coating, wherein the surface of the piston ring is subjected to nitriding treatment.

The preparation process of the multilayer multi-element composite hard PVD coating on the surface of the piston ring is conducted in a PVD vacuum deposited apparatus, and comprises the following steps:

(1) subjecting the as-received surface of a piston ring to nitriding treatment;

(2) conducting purification treatment as described in EXAMPLE 1;

(3) controlling the vacuum degree in the vacuum chamber at 1.02 Pa, adjusting the bias voltage of the piston ring to −17V, igniting Cr target material cathodes to generate cold field induced arc discharge and depositing a Cr metal underlayer on the surface of the piston ring;

(4) gradually introducing nitrogen gas, adjusting the bias voltage of the piston ring to −40V, depositing a CrN ramping layer with various nitrogen content on the Cr metal underlayer till depositing a uniform CrN deposited layer as the vacuum degree is maintained at 4 Pa;

(5) igniting CrSi target material cathodes, gradually increasing cathode current and depositing a Cr(Si)N ramping layer with increasing metal content on the CrN deposited layer; when the cathode current is increased to 60 A, maintaining the cathode current and depositing a uniform Cr(Si)N deposited layer;

(6) ending the process after 5 h deposition; turning off the gas supply system, cathode system, bias voltage system, etc.; after the piston ring is cooled to below 150° C., opening the vacuum chamber and removing the piston ring out of the system.

The adding amount of Si element in the CrSi target material is 50% atm.

The number ratio of the cathode arc sources of the Cr metal target material to those of the CrSi target material is 3:2.

Example 3

A multilayer multi-element composite hard PVD coating on the surface of a piston ring, consists of, from the bottom to the top, a Cr metal underlayer, a CrN ramping layer, a CrN deposited layer, a Cr(Me)N ramping layer and a Cr(Me)N deposited layer. Said Me is the combination of W and B. The Cr metal underlayer has a thickness of 3 μm. The CrN ramping layer has a thickness of 4 μm. The CrN deposited layer has a thickness of 16 μm. The Cr(Me)N ramping layer has a thickness of 8 μm. The Cr(Me)N deposited layer has a thickness of 19 μm. The total thickness of the coating is 50 μm.

The present example provides a piston ring with the multilayer multi-element composite hard PVD coating, wherein the surface of the piston ring is not subjected to nitriding treatment.

The preparation process of the multilayer multi-element composite hard PVD coating on the surface of the piston ring is conducted in a PVD vacuum deposited apparatus, and comprises the following steps:

(1) conducting purification treatment as described in EXAMPLE 1;

(2) controlling the vacuum degree in the vacuum chamber at 1.38 Pa, adjusting the bias voltage of the piston ring to −23V, igniting Cr target material cathodes to generate cold field induced arc discharge and depositing a Cr metal underlayer on the surface of the piston ring;

(3) gradually introducing nitrogen gas, adjusting the bias voltage of the piston ring to −30V, depositing a CrN ramping layer with various nitrogen content on the Cr metal underlayer till depositing a uniform CrN deposited layer as the vacuum degree is maintained at 6 Pa;

(5) igniting CrMe target material cathodes, gradually increasing cathode current and depositing a Cr(Me)N ramping layer with increasing metal content on the CrN deposited layer; when the cathode current is increased to 80 A, maintaining the cathode current and depositing a uniform Cr(Me)N deposited layer;

(6) ending the process after 17 h deposition; turning off the gas supply system, cathode system, bias voltage system, etc.; after the piston ring is cooled to below 150° C., opening the vacuum chamber and removing the piston ring.

The adding amount of W and B elements in the CrMe target material is 30% atm.

The number ratio of the cathode arc sources of the Cr metal target material to those of the CrMe target material is 3:2.

Example 4

A multilayer multi-element composite hard PVD coating on the surface of a piston ring, consists of, from the bottom to the top, a Ti metal underlayer, a TiN ramping layer, a TiN deposited layer, a Ti(Me)N ramping layer and a Ti(Me)N deposited layer. Said Me is the combination of Si and Mo. The Ti metal underlayer has a thickness of 4 μm. The TiN ramping layer has a thickness of 2 μm. The TiN deposited layer has a thickness of 12 μm. The Ti(Me)N ramping layer has a thickness of 6 μm. The Ti(Me)N deposited layer has a thickness of 15 μm. The total thickness of the coating is 39 μm.

The present example provides a piston ring with the multilayer multi-element composite hard PVD coating, wherein the surface of the piston ring is subjected to nitriding treatment.

The preparation process of the multilayer multi-element composite hard PVD coating on the surface of the piston ring is conducted in a PVD vacuum deposited apparatus, and comprises the following steps:

(1) subjecting the as-received surface of a piston ring to nitriding treatment;

(2) conducting purification treatment as described in EXAMPLE 1;

(3) controlling the vacuum degree in the vacuum chamber at 1.2 Pa, adjusting the bias voltage of the piston ring to −18V, igniting Ti target material cathodes to generate cold field induced arc discharge and depositing a Ti metal underlayer on the surface of the piston ring;

(4) gradually introducing nitrogen gas, adjusting the bias voltage of the piston ring to −33V, depositing a TiN ramping layer with various nitrogen content on the Ti metal underlayer till depositing a uniform TiN deposited layer as the vacuum degree is maintained at 5 Pa;

(5) igniting TiMe target material cathodes, gradually increasing cathode current and depositing a Ti(Me)N ramping layer with increasing metal content on the TiN deposited layer; when the cathode current is increased to 75 A, maintaining the cathode current and depositing a uniform Ti(Me)N deposited layer;

(6) ending the process after 13 h deposition; turning off the gas supply system, cathode system, bias voltage system, etc.; after the piston ring is cooled to below 150° C., opening the vacuum chamber and removing the piston ring.

The adding amount of Si and Mo elements in the TiMe target material is 20% atm.

The number ratio of the cathode arc sources of the Ti metal target material to those of the TiMe target material is 2:3.

The applicant states that the present invention to describe the detailed structure features and preparation method of the present invention via the above examples, but the present invention is not limited to the above detailed structure features and preparation method, i.e. the present invention does not have to rely on the above detailed structure features and preparation method to implement. A person skilled in the art would understand, any modification of the present invention, the equivalent replacement to the elements used in the present invention, the addition of an auxiliary ingredient, the selection of a specific mode, etc. all fall within the protection and disclosure scope of the present invention.

The preferred embodiment of the present invention is described in details in above, but the present invention is not limited to the specific details of the above embodiment. Within the technical conceptive scope of the present invention, various simple changes can be made to the technical solutions of the present invention, and all the simple changes belong to the protection scope of the present invention.

In addition, it should be noted that in the case of not contradictory, each specific technical feature of the above embodiments may be combined in any suitable manner. To avoid unnecessary repetition, the present invention does not provide further description for the various possible combinations.

Moreover, the various embodiments of the present invention can also be combined arbitrarily, as long as the combinations does not deviate from the spirit of the invention and they should also be considered as the disclosure of the present invention.

The invention claimed is:

1. A multilayer multi-element composite hard PVD coating for use on a surface of a piston ring, comprising a low friction coefficient and being applied by physical vapor deposition, wherein the coating consists of, from a bottom to a top, a single metal adhesion underlayer, a single nitride ramping layer that has a nitrogen content that increases from the bottom to the top of the layer, a single nitride deposited layer, a multi-element nitride ramping layer with increasing metal content, and a multi-element nitride deposited layer; wherein:
the single metal adhesion underlayer is Cr,
the single nitride deposited layer is CrN,
the multi-element nitride deposited layer is Cr(Me)N, Me is selected from the group consisting of Mo, W, and B; and the friction coefficient of the coating is further reduced by 5 to 20% compared with the single nitride deposited layer.

2. The coating according to claim 1, wherein
the single metal adhesion underlayer has a thickness of 1-4 μm;
the single nitride ramping layer has a thickness of 1-6 μm;
the single nitride deposited layer has a thickness of 5-20 μm;
the multi-element nitride ramping layer has a thickness of 2-10 μm;
the multi-nitride deposited layer has a thickness of 5-20 μm; and
a total thickness of the coating is within the range of 14-60 μm.

3. A piston ring with the multilayer multi-element composite hard PVD coating according to claim 1 on a surface thereof.

4. The piston ring according to claim 3, wherein the surface of the piston ring is subjected to a nitriding treatment.

5. A process of preparing the multilayer multi-element composite hard PVD coating according to claim 1 on a surface of a piston ring, wherein the process is conducted in a PVD vacuum deposition device having a vacuum chamber and comprises the following steps:

(1) subjecting the surface of a piston ring to plasma cleaning or other cleaning treatments;

(2) igniting single metal target material cathodes to generate cold field induced arc discharge and depositing the single metal adhesion underlayer on the surface of the piston rings;

(3) gradually introducing nitrogen gas; depositing the single nitride ramping layer with increasing nitrogen content on the single metal underlayer; and subsequently depositing the single nitride deposited layer; and (4) igniting multi-element target material cathodes, gradually increasing a current applied to the multi-element target material cathodes, depositing a multi-element nitride ramping layer with increasing metal content on the single nitride deposited layer, and depositing the multi-element nitride deposited layer with such having a constant amount of different elements.

6. The process according to claim 5, wherein during step (2), a vacuum degree in the vacuum chamber is controlled within 1.02-1.38 Pa, and a bias voltage of the piston ring is adjusted to between −17 and −23 V.

7. The process according to claim 5, wherein at the end of step (3) the nitrogen gas is purged, and a bias voltage of the piston ring is adjusted to between −30 and −40V.

8. The process according to claim 5, wherein the single nitride ramping layer is deposited until the single nitride deposited layer begins to be deposited and after a vacuum degree is kept within 4-6 Pa.

9. The process according to claim 5, wherein in step (4), a cathode current of the multi-element target cathodes is increased to 60-80 A, and then the cathode current is maintained and the multi-element nitride deposited layer is deposited.

10. The process according to claim 5, wherein the process is ended after 5-20 hours of deposition.

11. The process according to claim 5, wherein after step 4 the piston ring is cooled to lower than 150° C. and the vacuum chamber is opened to remove the piston ring out of the PVD vacuum deposition device.

12. The process according to claim 5, wherein, before step (1), a nitriding treatment and a subsequent surface grinding treatment are conducted; or a surface grinding treatment is conducted without a nitriding treatment, in order to remove a non-porous microstructure to ensure adhesion of the coating.

13. The process according to claim 5, wherein the multielement target material is selected from CrMo, CrW, and CrB.

14. The process according to claim 13, wherein, the amount of Mo, W, or B in the multi-element target material is 5-50% atm.

15. The process according to claim 5, wherein a number ratio of the single metal target material cathodes to the multi-element target material cathodes is 2:3 or 3:2.

* * * * *